United States Patent [19]

Ballou

[11] Patent Number: 5,105,123
[45] Date of Patent: Apr. 14, 1992

[54] HOLLOW ELECTRODE PLASMA EXCITATION SOURCE

[75] Inventor: Nathan E. Ballou, West Richland, Wash.

[73] Assignee: Battelle Memorial Institute, Richland, Wash.

[21] Appl. No.: 596,417

[22] Filed: Oct. 10, 1990

Related U.S. Application Data

[63] Continuation of Ser. No. 263,063, Oct. 27, 1988, abandoned.

[51] Int. Cl.$^5$ .................. H01J 49/04; H05H 1/24
[52] U.S. Cl. .................. 315/111.21; 315/111.81; 315/111.91; 313/231.31; 250/423 R; 250/425
[58] Field of Search ............ 315/111.21, 111.81, 315/111.91; 313/231.31; 250/423 R, 425

[56] References Cited

U.S. PATENT DOCUMENTS

| | | | |
|---|---|---|---|
| 3,258,633 | 6/1966 | Swartz | 313/230 |
| 3,323,002 | 5/1967 | Lafferty | 315/36 |
| 3,621,460 | 11/1971 | Willett | 331/94.5 |
| 3,685,911 | 8/1972 | Dahlquist et al. | 356/86 |
| 4,157,471 | 6/1979 | Mlekodaj | 250/423 R |
| 4,377,773 | 3/1983 | Hersheovitch et al. | 315/111.81 |
| 4,521,286 | 6/1985 | Horwitz | 204/192 E |
| 4,596,030 | 6/1986 | Herziger et al. | 378/119 |
| 4,647,818 | 3/1987 | Ham | 315/111.21 |
| 4,682,026 | 7/1987 | Douglas | 315/111.81 X |
| 4,707,637 | 11/1987 | Harvey | 315/111.81 |
| 4,730,111 | 3/1988 | Vestal et al. | 250/423 R |
| 4,760,262 | 7/1988 | Sampayan et al. | 315/111.81 X |
| 4,812,040 | 3/1989 | Marcus et al. | 250/423 R X |
| 4,847,476 | 7/1989 | Sato et al. | 250/423 R X |
| 4,853,539 | 8/1989 | Hall et al. | 250/423 R X |

FOREIGN PATENT DOCUMENTS 0140005  8/1985  European Pat. Off. .

OTHER PUBLICATIONS

Falk et al., "Fanes (Furnace Atomic Nonthermal Excitation Spectrometry)-A New Emission Technique with High Detection Power", *Spectrochimica Acta.*, vol. 36B, No. 8, pp. 767-771, 1981.

Falk et al., "Furnace Atomisation with Non-Thermal Excitation-Experimental Evaluation of Detection Based on a High-Resolution Echelle Monochromator Incorporating Automatic Background Correction", *Analyst*, Dec. 1983, vol. 108, pp. 1459-1465.

Falk et al., "Silberbestimmung in Golddraht durch nichtthermische Anregung im Graphitrohrofen (FANES)," *Fresenius Z. Anal. Chem.*, 307, 362-364 (1981).

Scheeline et al., "Direct Solid Elemental Analysis: Pulsed Plasma Sources", *Analytical Chemistry*, vol. 59, No. 20, Oct. 15, 1987, pp. 1185A-1196A.

*Primary Examiner*—Eugene R. LaRoche
*Assistant Examiner*—Do Hyum Yoo
*Attorney, Agent, or Firm*—Dellett, Smith-Hill and Bedell

[57] ABSTRACT

A plasma source incorporates a furnace as a hollow anode, while a coaxial cathode is disposed therewithin. The source is located in a housing provided with an ionizable gas such that a glow discharge is produced between anode and cathode. Radiation or ionic emission from the glow discharge characterizes a sample placed within the furnace and heated to elevated temperatures.

12 Claims, 5 Drawing Sheets

HOLLOW ELECTRODE PLASMA EXCITATION SOURCE

The U.S. Government has a paid-up license in this invention and the right in limited circumstances to require the patent owner to license others on reasonable terms as provided for by the terms of Contract No.: DE-AC06-76RLO 1830 awarded by the U.S. Department of Energy.

This application is a continuation of application Ser. No. 07/263,063 filed Oct. 27, 1988, now abandoned.

BACKGROUND OF THE INVENTION

The present invention relates to a hollow electrode plasma excitation source and particularly to such a source wherein the hollow electrode comprises an anode having a relatively positive voltage supplied thereto, and within which is received a centrally disposed cathode.

Systems are known for atomic emission spectrometry wherein graphite furnace vaporization is combined with a glow discharge. The furnace vaporizes a substance which is to be analyzed, and the glow discharge generates excited states of atoms in the vapor so that their emissions can be measured. Thus, a polychromator used to view the glow discharge can be employed for analysis of the vaporized substance. According to the known system, a tubular graphite furnace is used for sample vaporization, and also as the glow discharge cathode. An electrode external to the end of the furnace serves as the anode for the glow discharge. The glow discharge in the furnace cathode comprises the source of radiation which is analyzed.

Unfortunately the prior art apparatus has experienced problems relative to stability and range of stability of the plasma, as well as reproducibility of analysis. Also, electric fields between the furnace and the vacuum housing for the furnace require shielding considerations.

SUMMARY OF THE INVENTION

In accordance with the present invention in a preferred embodiment thereof, an enclosure is provided with a gas at reduced pressure which is adapted to serve as a plasma medium. A first hollow electrode, positioned within the enclosure, has a relatively positive d.c. potential applied thereto, while a second electrode within the first electrode receives a relatively negative d.c. potential. In accordance with the preferred emobdiment, the first, hollow electrode is formed or graphite or a refractory metal and is heated by passing a current therethrough, elevating the same in temperature for vaporizing a sample placed within the electrode. The sample is vaporized, and excited by the plasma produced between the first and second electrodes, whereby radiation is emitted which is a characteristic of the sample.

In the apparatus according to the present invention, a stable plasma is produced and retained within the hollow electrode or furnace. This construction minimizes electric fields between the furnace and the surrounding housing, thereby simplifying electrical shielding requirements and enhancing reliability of operation. Reliable plasma ignition and a stable plasma are provided by this apparatus.

It is accordingly an object of the present invention to provide an improved plasma source for use in analysis and the like, said source being characterized by stability and reliable plasma ignition.

It is another object of the present invention to provide an improved plasma source combining the functions of a source and a vaporization furnace.

It is a further object of the present invention to provide an improved plasma source for enabling accurate results in chemical analysis.

The subject matter of the present invention is particularly pointed out and distinctly claimed in the concluding portion of the specification. However, both the organization and method of operation, together with further advantages and objects thereof, may best be understood by reference to the following description taken in connection with accompanying drawings wherein like reference characters refer to like elements.

DRAWINGS

FIG. 1 is a schematic representation of a combined plasma source ad furnace according to the present invention, FIG. 2 is an end view of the FIG. 1 apparatus, FIGS. 3 and 3A are respectively more detailed perspective and rear views of the plasma source and furnace, and FIG. 4 is a schematic representation of another embodiment according to the present invention.

DETAILED DESCRIPTION

Figure 1:
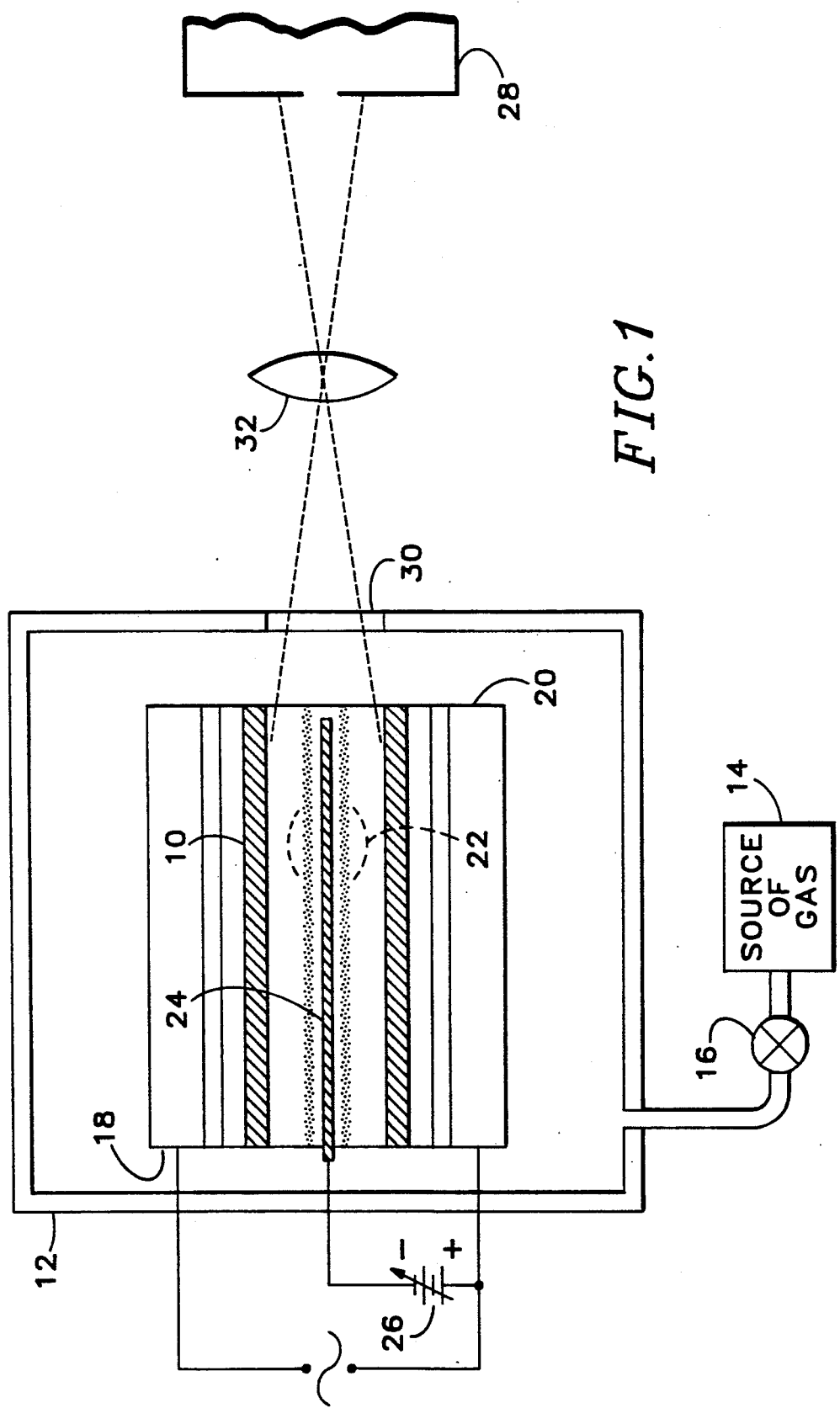
Figure 2:
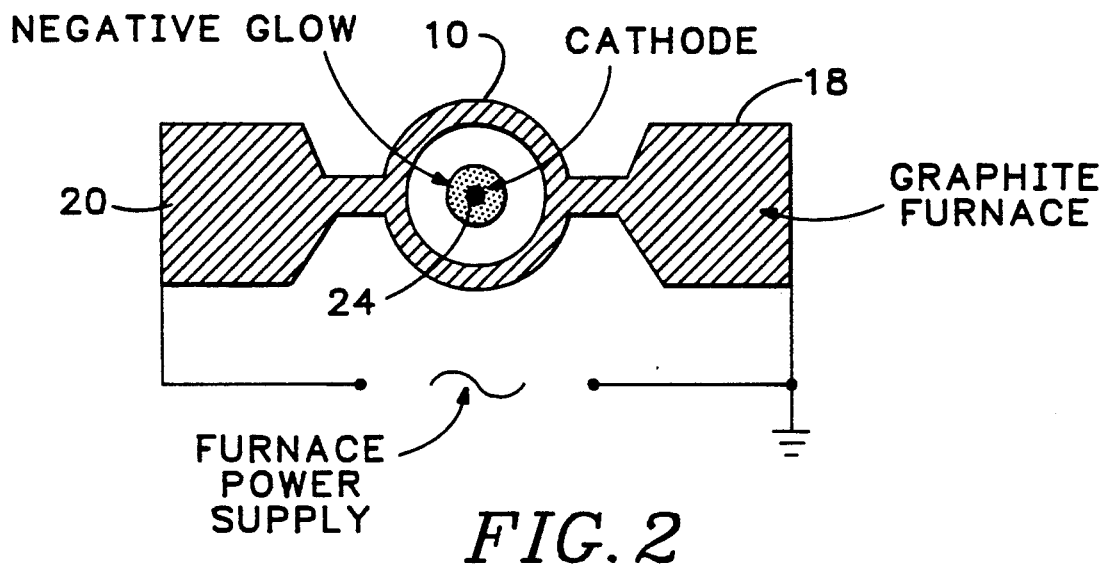

Referring to the drawing and particularly FIGS. 1 and 2, illustrating a hollow electrode plasma excitation source according to the present invention as employed for atomic emission spectrometry, a cylindrical furnace 10 formed of a refractory conductive material, suitably graphite, is located within a vacuum housing or enclosure 12. A source of gas communicates to housing 12 by way of valve 16 and it provides a noble gas (e.g. argon or helium), hydrogen, or mixtures of noble gas and hydrogen at pressures in the range of a fraction of a Torr to tens of Torr. A gas exit (not shown) can also be provided for the chamber. The furnace 10 suitably takes the form of a right circular cylinder having a pair of "wings" 18 and 20 integrally joined to sides thereof at 180° spaced locations, through which current from an a.c. source is supplied to the cylinder. In the course of vaporizing or atomizing a sample, 22, placed on the inside furnace wall, the furnace 10 may be brought to temperatures on the order of 1,000°-2,500° C.

The furnace 10 in accordance with the present invention is utilized as an anode, i.e., positive electrode, of the plasma excitation source, while an elongated central electrode 24, suitably a graphite rod positioned substantially coaxially within cylindrical furnace 10, comprises the cathode or negative electrode. Accordingly, furnace 10 and electrode 24 are connected respectively to the positive and negative terminals of d.c. power supply 26 for supplying a voltage of between approximately 200 volts d.c. and 2000 volts d.c. to establish a glow discharge primarily between the electrodes in the gas within enclosure 12, the gas serving as a plasma medium.

When the power supply 26 is activated, the gas within the furnace 10 is ionized and specifically a negative glow region is established around cathode electrode 24. The substance 22 to be analyzed is brought to a high temperature through activation of the furnace power supply and substance 22 is vaporized into the negative glow region. The glow region may be viewed by an echelle polychromator 28 through a sapphire window 30 disposed in one wall of vacuum housing 12. An annular image of the glow region is focused on the slit of the polychromator by means of an intermediately placed calcium fluoride lens 32. As will be appreciated by those skilled in the art, the frequencies of radiation emitted in the glow region are indicative of elements in the sample 22, as sample 22 is vaporized and passes into the ionized region of the discharge. The discharge generates excited states of sample atoms causing emissions that can be measured.

The furnace 10 has been described as formed of graphite and may comprise pyrolytically coated graphite, or may be formed of some other refractory conductive material. The electrode 24 may similarly comprise a material such as pyrolytically coated graphite or tungsten wire.

Figure 3:
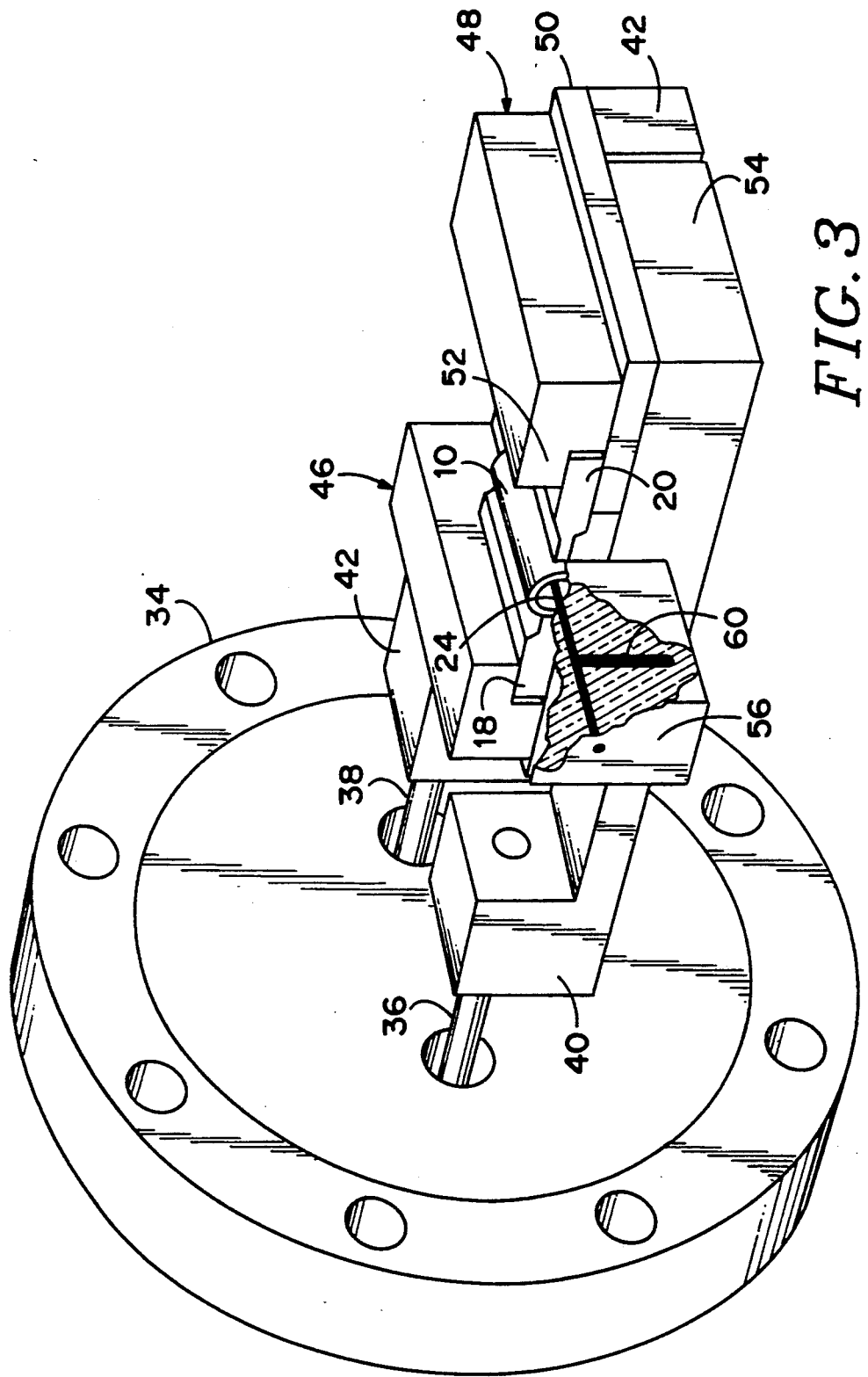
Figure 3A:
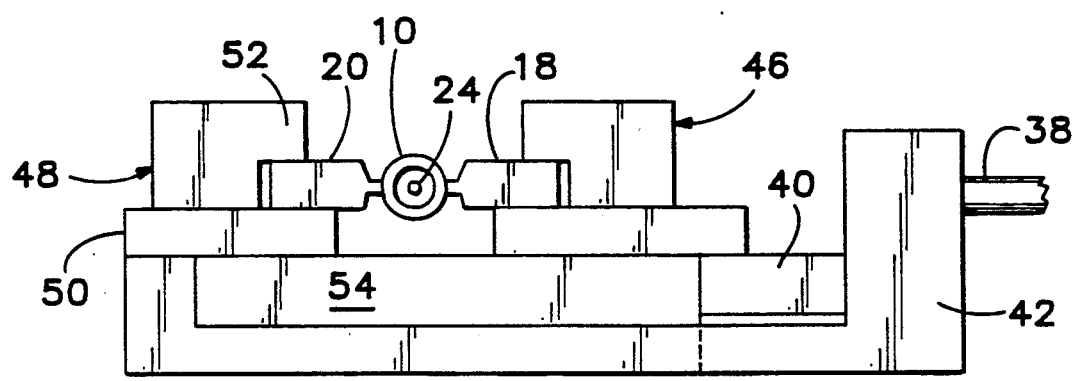

FIGS. 3 and 3A illustrate the internal construction of the apparatus in greater detail. A vacuum flange 34 supports a furnace assembly on two horizontally mounted high-current, copper feed-through conductors 36 and 38 which pass through the flange cover via insulating bushings. The flange locates the furnace assembly within a vacuum housing suitably consisting of a six-way stainless steel cross (not shown) having appropriate flanges on the six ports and generally corresponding to housing 12 in FIG. 1. This arrangement allows the furnace components to be assembled or repaired outside the vacuum housing simply by removing flange 34.

L-shaped copper blocks 40 and 42 are respectively joined to the aforementioned conductors 36 and 38 and provide paths to respective furnace clamps 46 and 48. The clamps are C-shaped, each having a lower deck 50 upon which one of the furnace "wings" 18 and 20 rests, and an upper jib 52 bearing on top of a wing. The clamps 46 and 48 are supported on a machinable glass platform 54, mechanically secured to blocks 40 and 42 and acting to position the clamps in parallel alignment. A second machinable glass member 56 is located outboard from one end of furnace 10 and is joined to the aforementioned glass platform 54, while extending upwardly therefrom to position central electrode 24 within the furnace. The central electrode 24 in this instance was a slender rod of graphite, analogous to a pencil lead, embedded in member 56. The electrode 24 is received through a bore in member 56, but is unsupported where it extends through furnace 10. A conductor 60, which may comprise a spring or the like, contacts electrode 24 and passes downwardly through member 56 for making connection with an intermediate conductor leading to a supply such as supply 26 in FIG. 1. In this construction, furnace 10 was 1.9 cm long having an inside diameter of 0.4 cm. The slender graphite rod 24 had a diameter 0.05 cm.

In a particular example, a sample (corresponding to sample 22 in FIG. 1) was deposited in aqueous solution of 0.05% HNO3 inside furnace 10 and dried in flowing argon. The chamber 12 was then evacuated to 2.7 kPa argon. The power supply 26 was operated at a voltage sufficient to ignite a plasma current between 20 mA and 30 mA, and the background emission spectra was monitored for five seconds. Thereupon, the furnace was heated by applying power across the conductors 36 and 38 to bring the furnace approximately to an atomization temperature of 2,300° C., furnace power being held for five seconds. Then the system was brought back to atmospheric pressure with argon and the chamber was opened. Water cooling can be employed for rapid cooling of the system, e.g. within conductors 36 and 38 and blocks 40 and 42.

The plasma was easy to ignite and stable, and accurate analytical results were produced. Intensity measurements were repeated approximately 56 times a second with a polychromator viewing the glow region through a sapphire window in a flange cover of the vacuum housing (not shown) positioned for viewing the open end of furnace 10 in FIG. 3 opposite member 56.

Figure 4:
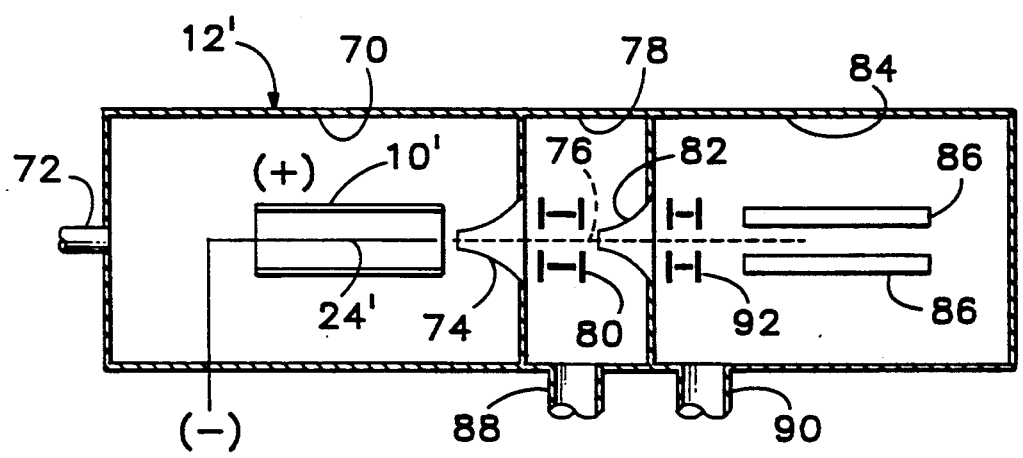

FIG. 4 schematically illustrates a hollow electrode plasma apparatus according to the present invention employed as an ion source for mass spectrometry. A sample for analysis is preferably vaporized and constituent atoms of the vapor are ionized by means of a plasma generated in a gas stream. The ions in the gas stream are transported from the ion source through a gas skimmer located in a wall of the apparatus housing and into a mass spectrometer for measurement.

Considering FIG. 4 in greater detail, hollow electrode 10′, which desirably comprises a vaporization furnace, is centrally positioned within a first chamber 70 of an elongate housing 12′ at one end of which is supplied a source of flowing gas via entrance port 72. The gas flowing into the enclosure can be noble gas (e.g. argon or helium), hydrogen, or mixtures of noble gas and hydrogen. The pressure level within chamber 70 is low, on the order of approximately one Torr.

The tubular electrode 10′ is connected to a positive voltage relative to coaxial central rod electrode 24′ which is connected to a negative voltage such that the voltage difference between electrodes 10′ and 24′ is in the approximate range of 200 volts to 2,000 volts d.c The construction of the electrodes 10′ and 24′ is substantially the same as described in respect to the previous embodiment, with electrode 10′ being formed with side connections through which a substantial current is passed for raising electrode 10′ to a temperature on the order of 1,000°–2,500° C. whereby a sample placed within electrode 10′ is vaporized and the constituent atoms of the vapor are ionized by means of the plasma generated within electrode member 10′ and in the gas stream delivered from port 72.

Sampler cone 74 forms the exit of chamber 70 and is coaxially aligned with electrodes 10′ and 24′. The path of travel of an exit ion stream is indicated by dashed line 76. The cone 74 is suitably maintained at a negative potential of approximately 0–100 volts with respect to electrode member 10′.

The ion stream, as indicated at 76, passes into a second chamber 78 and through an einzel lens 80 acting to focus the ion stream at the end aperture of skimmer cone 82 disposed between chamber 78 and chamber 84 wherein mass spectrometer means, as represented by plates 86, is located. The cone 82 is located at the chamber exit partially to separate the gas from the ions generated in the plasma and which travel through the hole at the apex of the cone. Chamber 78 is suitably maintained at a vacuum of approximately $10^{-3}$ Torr, being evacuated through port 88, while chamber 84 is desirably maintained at a vacuum of $10^{-6}$ to $10^{-7}$ Torr via port 90. A second einzel lens 92 is utilized for directing the ion beam toward the mass spectrometer apparatus which may comprise either a magnetic sector or a quadrupole mass spectrometer used for ion separation and measurement.

The apparatus can be employed for qualitative and quantitative isotopic and elemental determinations. Calibration measurements with known quantities of given elements permit quantitative analysis to be done. Highly precise and accurate determinations can be made by adding known quantities of isotopic tracers of elements of interest to the sample at the outset of the analysis.

The advantages attendant to the FIG. 4 apparatus are similar to those discussed in connection with the previous embodiment, i.e., ionization is easily produced and maintained and is quite stable, with the attendant enhancement of result accuracy.

While the hollow electrode plasma apparatus according to the present invention has been described primarily in connection with spectrometric measurements, it is understood it is capable of other uses, for example for providing a chemical reaction medium wherein the reactants are heated inside a furnace proximate the ionizing discharge. Furthermore, while deposition of a sample on the furnace (i.e., hollow anode) wall is preferred, the sample may alternatively be deposited on the coaxial cathode electrode within the furnace.

Thus, while a preferred embodiment of the present invention has been shown and described, it will be apparent to those skilled in the art that many other changes and modifications may be made without departing from the invention in its broader aspects. The appended claims are therefore intended to cover all such changes and modifications as fall within the true spirit and scope of the invention.

I claim:

1. A hollow electrode plasma source apparatus comprising:
   an enclosure within which a reduced pressure can be maintained;
   means for providing a gas at reduced pressure to said enclosure wherein said gas is adapted to serve as a plasma medium;
   a first hollow electrode supported within said enclosure and within which a sample substance is receivable, wherein said first hollow electrode serves as a furnace including means for heating said first hollow electrode to a temperature at which said sample substance is vaporized;
   a second electrode positioned within said first electrode;
   means for providing a relatively positive D.C. potential and means for applying said positive potential to said first electrode; and
   means for providing a relatively negative D.C. potential and means for applying said negative potential to said second electrode;
   wherein the potential difference between said electrodes is of a value for ionizing said gas and establishing a glow discharge between said electrodes in proximity to said second electrode for receiving vapor from said sample substance as provided to said glow discharge by said vaporization.

2. The apparatus according to claim 1 wherein said first electrode is tubular and said second electrode is substantially coaxial therewithin.

3. The apparatus according to claim 1 wherein said first hollow electrode is formed of a refractory conductive material to serve as said furnace.

4. The apparatus according to claim 3 wherein said means for heating said first hollow electrode comprises connection means for applying an electric current across said first hollow electrode for passing through said first hollow electrode to provide resistance heating to an elevated temperature.

5. The apparatus according to claim 1 wherein said enclosure is provided with exit means through which characteristic emission passes in response to excitation of the vapor from said sample substance as a result of locating said sample substance proximate said glow discharge and heating said sample substance to an elevated temperature.

6. The apparatus according to claim 5 wherein said exit means comprises a window, and further including means for measuring radiation excited by said glow discharge.

7. The apparatus according to claim 1 wherein said enclosure is provided with exit means through which characteristic emission passes in response to ionization of the vapor from said sample substance as a result of locating said sample substance proximate said glow discharge and heating said sample substance to an elevated temperature.

8. The apparatus according to claim 7 wherein said exit means comprise a gas exit, and further including mass spectrometer means for separation and measurement of ions provided by said glow discharge.

9. The apparatus according to claim 1 wherein said first electrode is formed of graphite.

10. The apparatus according to claim 1 wherein said first electrode is formed of a refractory conductive material.

11. The apparatus according to claim 1 wherein said second electrode is formed of graphite.

12. The apparatus according to claim 1 wherein said second electrode is formed of tungsten.

* * * * *